(12) United States Patent
Marty et al.

(10) Patent No.: US 6,828,646 B2
(45) Date of Patent: Dec. 7, 2004

(54) ISOLATING TRENCH AND MANUFACTURING PROCESS

(75) Inventors: Michel Marty, Varces (FR); Francois Leverd, Saint Ismier (FR); Philippe Coronel, Barraux (FR); Joaquin Torres, Saint Martin le Vinoux (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/272,444

(22) Filed: Oct. 16, 2002

(65) Prior Publication Data

US 2003/0098493 A1 May 29, 2003

(30) Foreign Application Priority Data

Oct. 17, 2001 (FR) .............................. 01 13375

(51) Int. Cl.⁷ .............................................. H01L 29/00
(52) U.S. Cl. ........................ 257/501; 257/506; 257/510; 257/522; 438/221; 438/296; 438/424; 438/435
(58) Field of Search ................................ 257/510, 513, 257/522, 524, 506, 501; 438/221, 296, 424, 435

(56) References Cited

U.S. PATENT DOCUMENTS

| 6,140,207 A | 10/2000 | Lee ............................. 438/427 |
| 6,265,754 B1 | 7/2001 | Sung ........................... 257/516 |

FOREIGN PATENT DOCUMENTS

| EP | 0054659 | 6/1982 | ........... H01L/21/76 |
| EP | 1209738 | 5/2002 | ........... H01L/21/62 |
| JP | 03229443 | * 10/1991 | ........... H01L/21/76 |
| JP | 11243412 | 9/1999 | ........... H01L/21/76 |

OTHER PUBLICATIONS

Patent Abstracts of Japan, vol. 2000, No. 09, Oct. 31, 2000 & JP 2000 183149A (Sanyo Electric Co. Ltd.), Jun. 30, 2000.

* cited by examiner

Primary Examiner—Hsien-Ming Lee
(74) Attorney, Agent, or Firm—Lisa K. Jorgenson; Allen, Dyer, Doppelt, Milbrath & Gilchrist, P.A.

(57) ABSTRACT

An isolation trench formed in a semiconductor substrate has side walls and a bottom wall. Spacers are on the side walls and face each other for forming a narrow channel therebetween. The bottom wall and the spacers are coated with an electrically insulating material for delimiting a closed empty cavity in the channel. The isolation trench is applicable to the manufacture of integrated circuits.

21 Claims, 4 Drawing Sheets

US 6,828,646 B2

ISOLATING TRENCH AND MANUFACTURING PROCESS

FIELD OF THE INVENTION

The present invention relates to integrated circuits, and in particular, to an integrated circuit using a silicon substrate with isolation trenches formed therein for isolating the different elements of the integrated circuit.

BACKGROUND OF THE INVENTION

Referring initially to FIG. 1, a substrate 1 made of a semiconductor material includes two adjacent isolation trenches 21. The isolation trenches 21 are usually formed in the substrate 1 at the beginning of the manufacturing process, and are separated by active areas 5 that contain the different elements of the integrated circuit, such as transistors, diodes, resistances and capacitors, for example. Each isolation trench 21 includes sides 2 and a bottom 3, and is full of an electrically insulating material 20. In circuits made of silicon, which is by far the most frequently used semiconductor material in the microelectronics industry, the electrically insulating material 20 is silicon oxide.

Attempts have been made to reduce the surface dimensions of the trenches 21 to reduce the area of the integrated circuit. It is also desirable that the dielectric constant of the material filling the trench 21 be as low as possible to reduce the coupling capacitance between two elements of the integrated circuit located on opposite sides of the trench.

Since circuits are becoming more and more miniaturized, two adjacent isolation trenches 21 are very close to each other. The presence of a large amount of the electrically insulating material in the semiconductor substrate 1 generates mechanically stressed areas in the semiconductor material. This is because the electrically insulating material and the semiconductor material have very different coefficients of thermal expansion. The mechanically stressed areas start from the sides 2 and the bottom 3 of a trench 21, and extend towards the adjacent trench. These mechanical stresses are greater when the sides 2 of the trenches 21 are not tapered outwards from the bottom 3.

In FIG. 1, stress lines 4 are shown in the substrate 1 around the illustrated trenches 21. The areas in which the trenches 21 are closest together are the areas in which the highest stresses occur. If the intensity of the stresses is to high, the yield stress of the semiconductor material will be exceeded. This causes dislocations in the semiconductor material, which makes the integrated circuit unusable.

SUMMARY OF THE INVENTION

In view of the foregoing background, an object of the present invention is to provide an isolation trench structure which has a low coupling capacitance but does not induce high mechanical stresses in the substrate, even if the trench is very close to other trenches of the same type.

This and other objects, advantages and features in accordance with the present invention are provided by an isolation trench having a bottom and sides in a semiconductor substrate, and spacers facing each other are added onto the sides. These spacers are designed to form a narrow channel between the sides of the trench in the substrate. The bottom and the spacers are preferably coated with an electrically insulating material for delimiting a closed empty cavity.

The spacers may also be made from an electrically insulating material. Closing the cavity is done using a plug made by the electrically insulating material that coats the sides and the bottom. The plug is positioned below an upper surface of the substrate. By introducing this empty cavity, the quantity of electrically insulating material used is lower than that used in isolation trenches full of the electrically insulating material.

The empty cavity does not contain any solid material, and is full of air and/or residual gases. This reduces the isolation capacity of the trench, since the relative permittivity of the air or gases is on the order of 1. The relative permittivity of the electrically insulating coating material and the electrically insulating material from which the spacers are made is greater than 1, since silicon oxide with a relative permittivity of more than 4 is usually used.

The sides of each trench may be approximately parallel over the entire depth of the trench, but the sides are preferably tapered outwards from the bottom. This shape more efficiently prevents the appearance of dislocations in the substrate material. The sides may be approximately parallel at the end opposite the bottom, which is close to the opening. The bottom is usually flat.

The shape factor of the narrow channel is preferably greater than 1. This parameter is important in forming and closing the empty cavity. The spacers may be parallel or even tapered inwards from the bottom, and then taper outwards or become parallel to the surface of the substrate. The spacers may also be set back from the surface of the substrate to control the depth of the closing plug.

The present invention is also directed to an integrated circuit provided with at least one isolation trench as defined above. The integrated circuit may also comprise at least one second isolation trench that is wider than the isolation trench as also defined above. The second isolation trench includes a bottom and sides, with the sides having spacers thereon and facing each other for defining a narrow channel therebetween. The channel is full of electrically insulating material. The wider isolation trench is preferably made at the same time as the first isolation trench which has the empty cavity included therein.

Another aspect of the present invention is directed to a process for forming an isolation trench in a semiconductor substrate. The process preferably comprises etching the substrate to form sides and a bottom of the isolation trench, and depositing an electrically insulating material on the bottom and sides to form spacers facing each other.

The method further comprises etching the spacers to delimit a narrow channel between the sides in the substrate, and depositing an electrically insulating material that coats the spacers and the bottom for delimiting a closed empty cavity.

The process may comprise a thermal annealing before depositing the electrically insulating material to make the spacers, and to restore the surface condition of the sides and the bottom. The electrically insulating material that coats the spacers and the bottom may be doped, and the thermal annealing may be carried out after it is deposited so that the insulating material creeps.

When the empty cavity is closed using a closing plug that is recessed from the surface, the process may include a new step of depositing an electrically insulating material to fill in the recess. A polishing step may also be added to eliminate surplus electrically insulating material on the surface of the semiconductor substrate.

Depositing the electrically insulating material for coating the spacers and the bottom of the isolation trench also coats the spacers and a bottom of a wider isolation trench that may be formed in the semiconductor substrate without delimiting the closed empty cavity in the isolation trench. The process may further comprise depositing an electrically insulating material to completely fill the wider isolation trench.

BRIEF DESCRIPTION OF THE DRAWINGS

The present invention will be better understood after reading the description of example embodiments that are given for information purposes only and are in no way restrictive with reference to the attached drawings. The various figures are not drawn to scale in accordance with normal practice for illustrating integrated circuits.

DETAILED DESCRIPTION OF THE PREFERRED EMBODIMENTS

Figure 1:
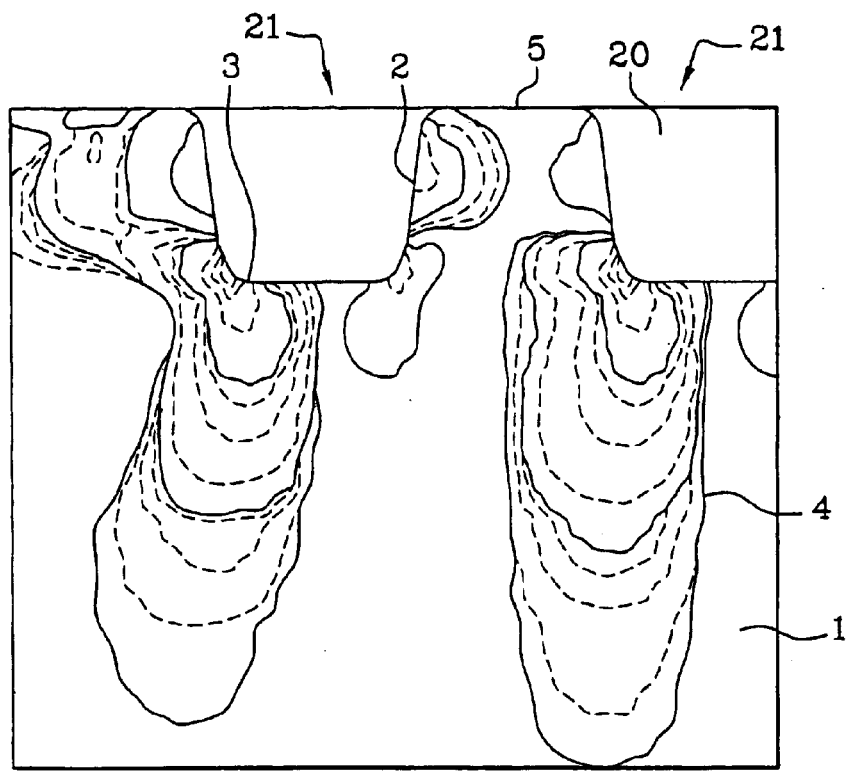
FIG. 1 illustrates stresses originating in the material of a semiconductor substrate in which two isolation trenches have been formed in accordance with the prior art.
Figure 2A:
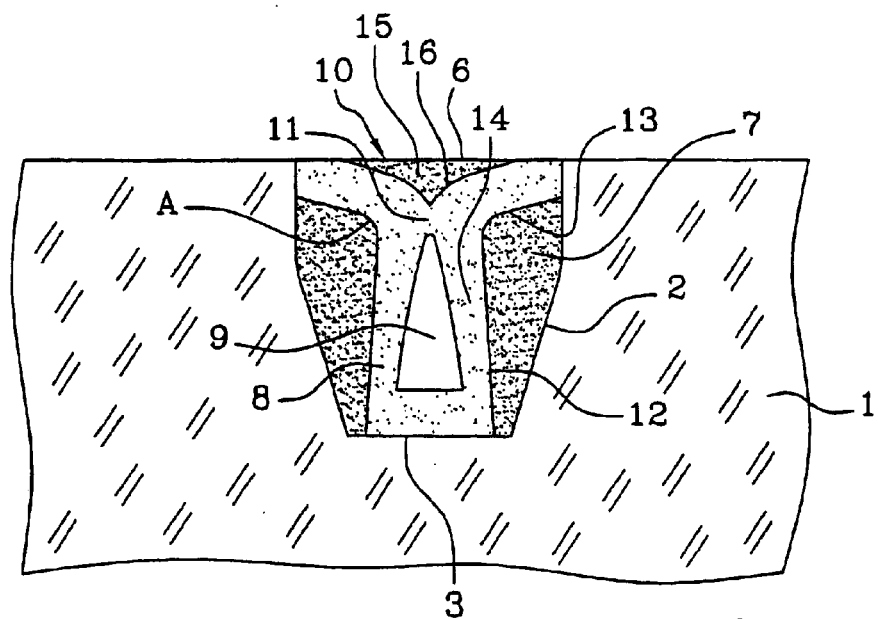
FIGS. 2A and 2B are cross-sectional views through isolation trenches formed in accordance with the present invention.
Figure 2B:
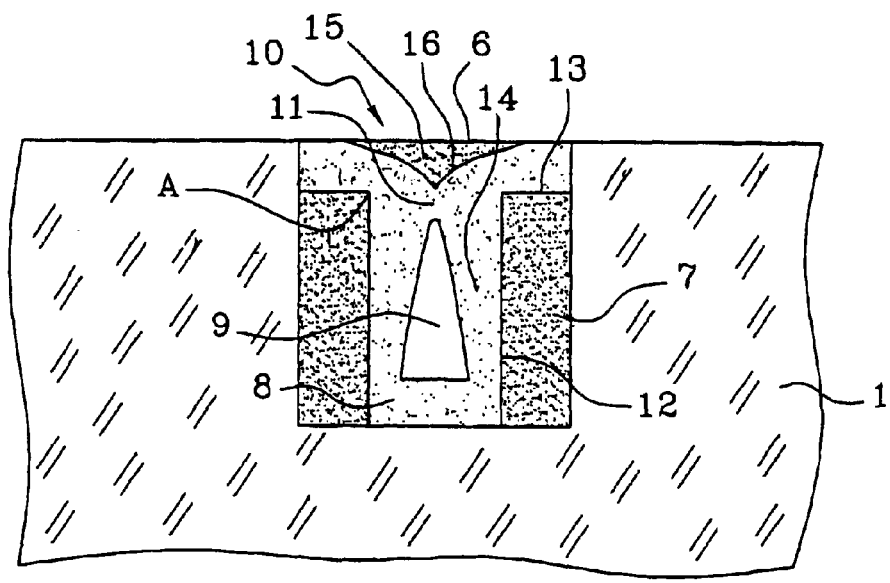

FIGS. 2A and 2B are cross-sectional views through two examples of an isolation trench 10 formed in accordance with the present invention. The isolation trench 10 is formed in a semiconductor substrate 1 of an integrated circuit. The integrated circuit is shown diagrammatically by the semiconductor substrate 1, and its other elements are not shown for reasons of clarity. The isolation trench 10 has a bottom 3, and two sides 2 facing each other and an opening 6 opposite the bottom 3. The bottom 3 is substantially flat.

In FIG. 2A, a portion of the sides 2 is tapered outwards from the bottom 3. This configuration gives the best results for stress reductions in the substrate 1. The sides 2 can then be substantially parallel as they extend further from the bottom 3. In FIG. 2B, the sides 2 are substantially parallel throughout the entire depth of the trench 10.

Spacers 7 are added to the sides 2 to create a narrow channel 14 therebetween. Like the sides 2, the spacers 7 are facing each other, and they are made from an electrically insulating material. If there is a change in the slope of the sides 2, this change will control the shape of the spacers 7.

The spacers 7 and the bottom 3 are coated with an electrically insulating material 8 that delimits a closed empty cavity 9 in the channel 14. A plug 11 is used to close the cavity, and is made using the electrically insulating material 8 that coats the bottom 3 and the spacers 2. The plug 11 closes the top of the cavity, and there is no risk that it will open up during the planarizing steps, if any are performed. Preferably, the spacers 7 are set back from the surface of the substrate 1 so that the depth of plug 11 can be adjusted.

The empty cavity 9 does not contain any solid material. Instead, the empty cavity 9 may contain air or residual gases that are formed when the trench is filled with the insulating material 8 or during later heat treatment operations applied to the substrate 1.

The profile of the spacers 7 delimiting the narrow channel 14 is different from the profile of the sides 2. This profile is such that the shape factor of the channel 14 is greater than 1, which means that its depth is greater than its average width. More precisely, the spacers 7 are substantially parallel or even slightly tapered inwards from the bottom 3. As the distance from the bottom 3 increases, they may taper outwards or become substantially parallel to the surface of substrate 1.

In the example shown in FIG. 2A, the spacers 7 have two successive portions 12, 13 with different inclinations. The first portion 12 of the spacers 7 closest to the bottom 3 become slightly closer to each other as the distance from the bottom increases and the distance to the opening 6 decreases. The second portion 13 of the spacers 7 closest to the opening 6 is tapered outwards towards the opening. The junction between the two portions 12, 13 is marked as reference A. The position of reference A controls the position of the closing plug 11. This junction A is embedded in the substrate 1.

In FIG. 2B, the first portion 12 of the spacers 7 closest to the bottom 3 is substantially parallel. The second portion 13 of the spacers 7 is substantially parallel to the surface of the semiconductor substrate 1.

Referring now to FIGS. 3A to 3G, the different steps in forming a first isolation trench 30 according to the present invention will be discussed. The trench 30 according to the present invention is illustrated on the left side of the figures, whereas the right side of the figures show a second isolation trench 31 that is wider than the first isolation trench 30. The two trenches 30, 31 are formed at the same time.

The wider isolation trench 31 has sides 32, a bottom 33 and an opening 36 opposite the bottom 33. The profile of the sides 32 is similar to the profile of the sides 2 of the narrower trench 30. The sides 32 are provided with spacers 37 facing each other, which are designed to form a channel 44 therebetween. The channel 44 is filled with an electrically insulating material.

The spacers 32 in the wide trench 31 are similar to the spacers in the other first trench 30. The electrically insulating material 8 that coats the spacers 7 and the bottom 3 of the first trench 30 may fill the channel 44 of the wider trench 31 if it is sufficiently thick, but it does not form a closed empty cavity.

There is no empty cavity in the wide trench 31, which is formed in a manner compatible with the formation of the narrow trench 30. Wide trenches 31 generate low coupling capacitances and low stresses in the substrate 1 due to their large dimensions, even when they are filled uniformly with a dielectric material.

Figure 3A:
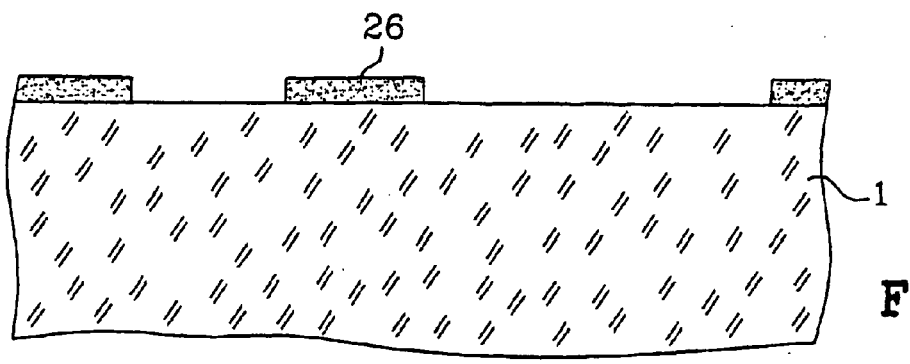
FIGS. 3A to 3G illustrate the process steps for forming an isolation trench in accordance with the present invention and for forming at the same time a wider isolation trench.
Figure 3B:
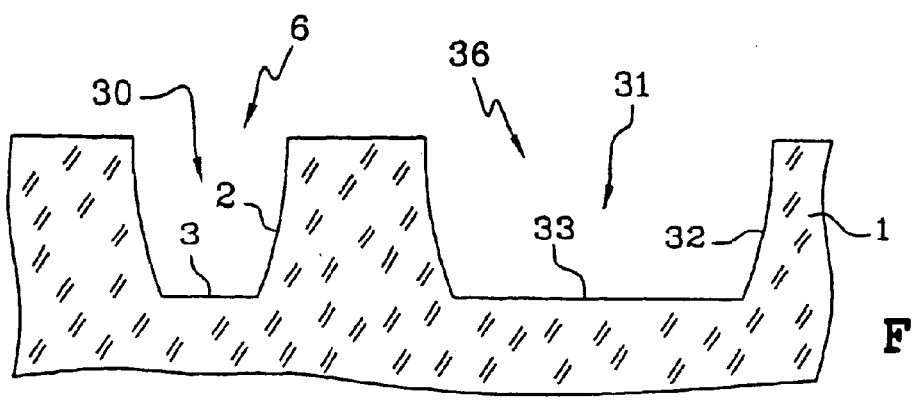

The starting point of the present invention is a substrate 1 made of a semiconductor material, which is the basis of integrated circuits. A photosensitive resin 26 is deposited on the substrate 1. The next step is to determine the pattern of the isolation trenches 30, 31. The pattern corresponds to the openings 6, 36 of the trenches 30, 31, and is transferred onto the resin 26. The resin is then developed (FIG. 3A).

A first etching step is performed to form the sides 2, 32 and the bottom 3, 33 of the isolation trenches 30, 31. The etching may be a plasma assisted dry etching, such as a reactive ion etching (RIE) for example. The resin 26 (FIG. 3B) is then removed.

The sides 2, 32 are tapered so that they become closer together as the distance from the bottom decreases 3, 33. A mix of hydrobromic acid HBr and oxygen $O_2$ can be used to etch the tapered sides. A gaseous mix of chlorine $Cl_2$, oxygen $O_2$ and hydrobromic acid HBr can also be used to etch the substantially parallel sides 2, 32. If the sides 2, 32 were configured as shown in FIG. 2A, which are substantially parallel at the opening and then tapering inwards, the etching would be done in two steps.

The substantially parallel sides would be etched first, followed by the sides tapering inwards. The same gaseous mix could be used to etch the two portions. For example, a mix of hydrobromic acid HBr and oxygen $O_2$ could be used, including an appropriate modification being made to the physical etching parameters. In other words, the RF power used to create the plasma, the pressure and the gas proportions would be appropriately modified.

The order of magnitude of the width of the trench 30 in which an empty cavity is formed is the same as the order of magnitude of the depth. For example, the width is between 0.2 and 0.4 micrometers, with the dimensions being chosen as a function of the elements that are to be isolated.

The next step is to apply a rapid thermal oxidation (RTO) type annealing to the trenches 30, 31 to restore the surface condition of their sides 2, 32 and their bottom 3, 33 that may have been damaged by the etching. This limits the circulation of leakage currents that can occur on these damaged surfaces.

Figure 3C:
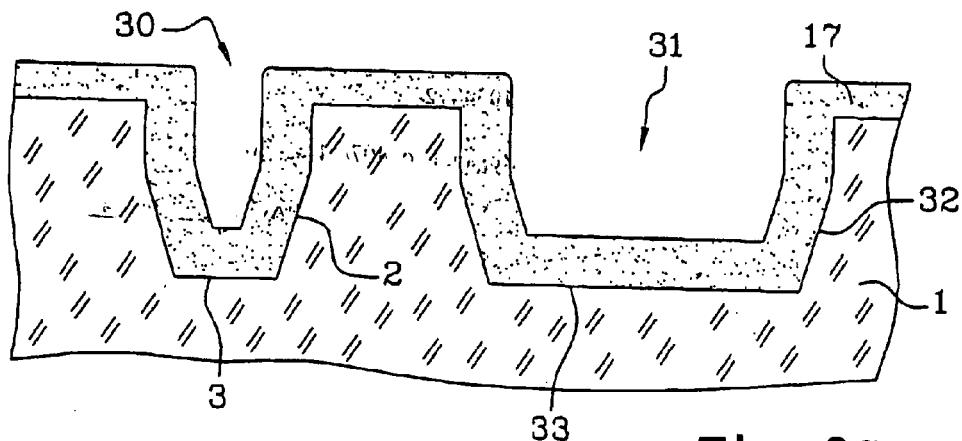
Figure 3D:
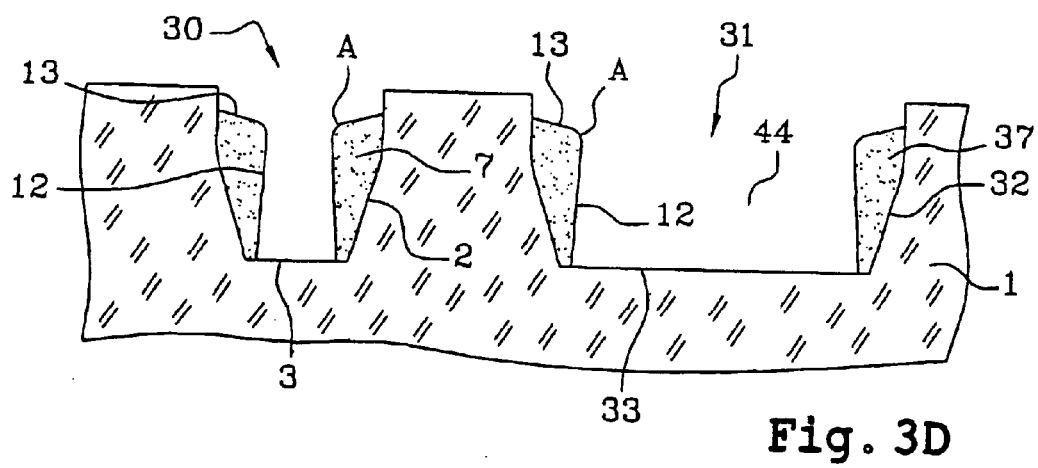

Spacers 7, 37 are then formed. An electrically insulating material 17 is deposited on the substrate 1 along the sides 2, 32 and on the bottom 3, 33 of the trenches 30, 31. In the example, silicon oxide is used if the substrate 1 is made of silicon, but other dielectric materials such as silicon nitride could be used to give equivalent topographic results. In this particular example, the deposit is conformal and the thickness deposited along the sides 2, 32 is approximately the same as the thickness deposited on the bottom 3, 33 and on the surface of the substrate 1 (FIG. 3C). The deposit does not have to be conformal. For example, the thickness of the insulating material 17 may be between 50 and 150 nanometers.

This type of deposit may be made by chemical vapor phase reactions by decomposition of tetraethylorthosilicate, known as TEOS, for example. The deposited isolation layer 17 is then etched directionally without a mask, for example by plasma, to eliminate the layer from the bottom 3, 33 of the trenches 30, 31 and from the surface of substrate 1 for defining the required profile of the spacers 7, 37. In the example, successive portions 12, 13 with different inclinations are made as described above (FIG. 3D) for each of the spacers.

If the first portion 12 of the spacers 7, 37 is slightly tapered outwards as the distance from the bottom 3, 33 decreases, a lateral overetching operation has to be included to obtain the required profile. This lateral etching is achieved using the highly reactive chemicals that form in the plasma. A gaseous mix, for example composed of carbon fluoride $C_4F_8$, argon and oxygen may be used.

The next step is to fill in the isolation trenches 30, 31 with the electrically insulating material 8 that coats the spacers 7, 37 and the bottom 3, 33. The electrically insulating material 8 in the narrowest isolation trench 30 delimits the closed empty cavity 9. The electrically insulating material 8 contributes to filling the narrow channel 44 of the isolation trench 31. There is a recess 18 in the widest trench 31. If the electrically insulating material 8 were thick, it could also possibly fill the widest isolation trench 31. The space between the spacers 37 is too large for an empty closed cavity to form.

The electrically insulating material 8 could be a nonconformal deposit of oxide. There are many methods of depositing an electrically insulating material to give a nonconformal deposit, as readily known by one skilled in the art. For example, this deposit could be made by chemical vapor phase reactions (CVD), or by plasma assisted chemical vapor phase reactions (PECVD) with at least one precursor making the deposit nonconformal. The precursor used may be TEOS or silane $SiH_4$, for example with oxygen. This deposit causes premature formation of the plug.

Figure 3E:
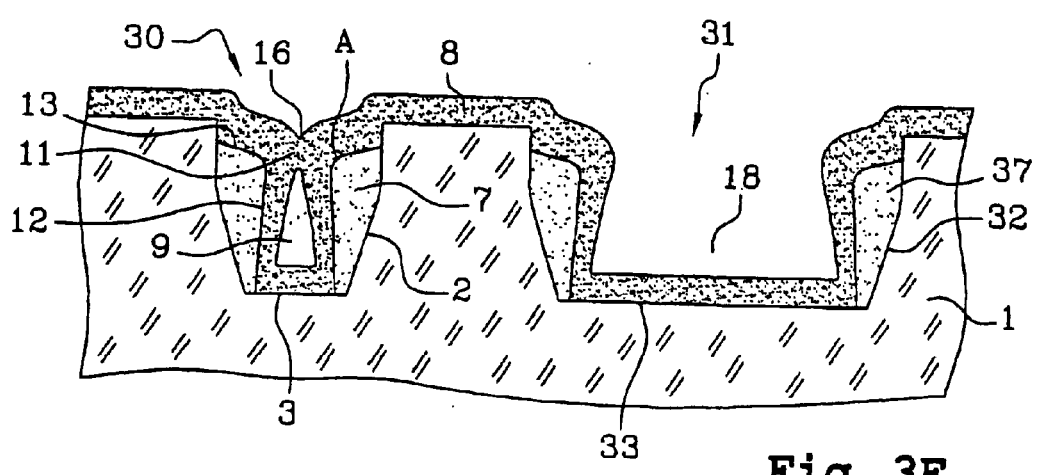

A nonconformal deposit is made faster on horizontal surfaces than on vertical surfaces. Therefore, this deposit will be made more quickly on the second portion 13 of the spacers 7, 37 than on the first portion 12. The empty cavity 9 forms in the narrowest trench 30, together with the plug 11 that closes it at the bottom. The plug 11 is located close to junction A (FIG. 3E).

A conformal deposit of electrically insulating material 8 would be suitable if the profile of the spacers tapering inwards is appropriate. The electrically insulating material 8 may be doped. For example, silicon oxide may be doped with boron or phosphorus. A thermal annealing step is then applied to diffuse the doping material atoms. This thermal annealing causes the electrically insulating material 8 to creep along the spacers 7, 37 so that the position of the closing plug 11 in the narrow trench 30 can be adjusted.

Figure 3F:
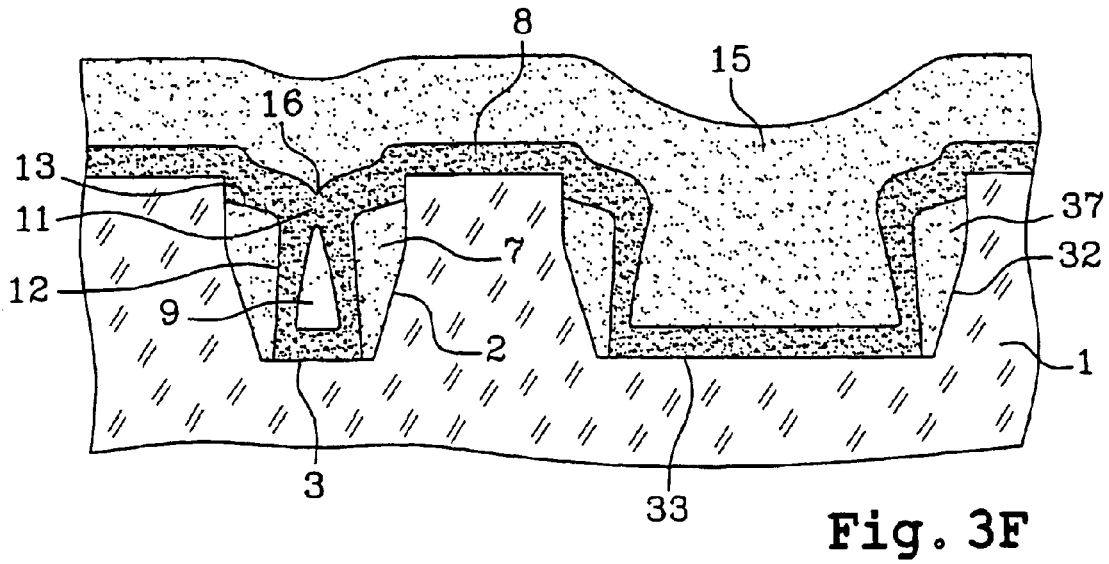
Figure 3G:
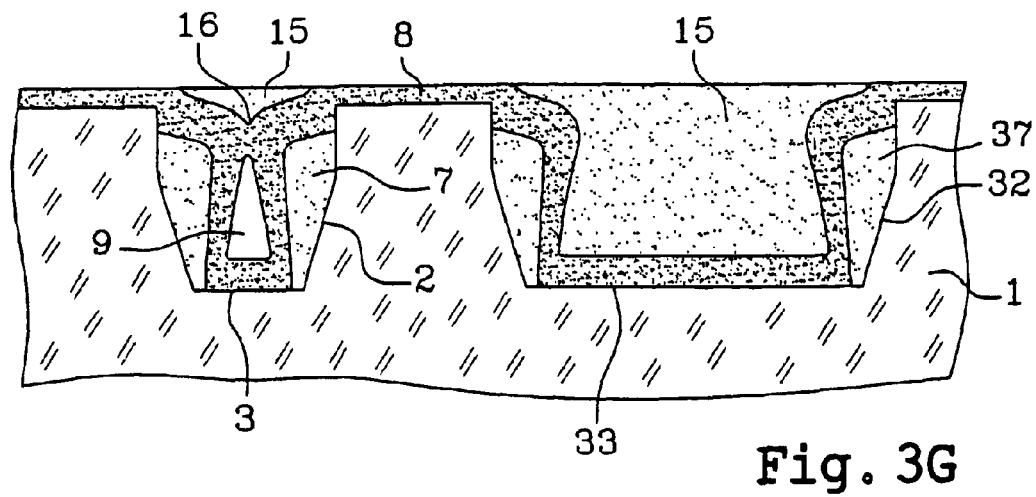

When the widest trench 31 is filled, a chemical-mechanical polishing (CMP) step can be carried out to eliminate the surplus oxide on the surface of the substrate 1. This step is done without any risk of opening the empty cavity 9 since it is closed at the bottom by its plug 11. In the example described, it is assumed that the nonconformal deposit of the electrically insulating material 8 has not filled the trench 31 and that the polishing step will be done later (FIG. 3G).

When the width of the isolation trench 30 in which the empty cavity 9 is formed is relatively wide compared with its depth, and the electrically insulating material 8 that forms the empty cavity 9 is not sufficiently thick, there may be a recess 16 on the surface of the plug 11 as shown in FIG. 2A. New electrically insulating material 15 may be deposited to fill this recess (FIG. 3F). This step preferably takes place before polishing. For example, the deposited electrically insulating material 15 may be silicon oxide or silicon nitride, and the electrically insulating material may be conformally deposited.

If the widest isolation trench 31 could not be filled by the electrically insulating material 8, then an additional deposit of an electrically insulating material 15, for example nitride or oxide, could be made before the polishing step to completely fill it (FIG. 3F). The polishing step is then done afterwards (FIG. 3G). This deposit of an electrically insulating material may be the deposit that fills in the recess 16 and the plug 11. For example, this additional deposit of insulating material 15 could be a conformal deposit.

That which is claimed is:

1. An integrated circuit comprising:
   a semiconductor substrate and at least one trench formed therein;
   spacers below a surface of said semiconductor substrate and on sides of the at least one trench and facing each other for defining a channel therebetween; and
   insulation material on said spacers, and on a bottom of the at least one trench for delimiting a closed empty cavity in the channel.

2. An integrated circuit according to claim 1, wherein said spacers comprise a second insulation material.

3. An integrated circuit according to claim 1, wherein said insulation material forms a plug for closing the cavity below an upper surface of said semiconductor substrate.

4. An integrated circuit according to claim 3, wherein an upper surface of said plug is recessed from the upper surface of said semiconductor substrate; and further comprising a third insulation material in the recess.

5. An integrated circuit according to claim 1, wherein the sides are tapered outwards from the bottom.

6. An integrated circuit according to claim 1, wherein the sides are substantially parallel to one another, and the sides are substantially perpendicular to the bottom.

7. An integrated circuit according to claim 1, wherein the sides are substantially parallel throughout an entire depth of the at least one trench.

8. An integrated circuit according to claim 1, wherein the bottom is substantially flat.

9. An integrated circuit according to claim 1, wherein a depth of the at least one trench is greater than an average width thereof.

10. An integrated circuit according to claim 1, wherein said spacers have lower portions substantially parallel to one another as a distance from the bottom increases, and upper portions that taper outwardly.

11. An integrated circuit according to claim 1, wherein said spacers have lower portions that taper towards one another as a distance from the bottom increases, and upper portions that taper outwardly.

12. An integrated circuit according to claim 1, wherein said semiconductor substrate further includes a second trench formed therein, the second trench having a width greater than a width of the at least one trench; and further comprising:

spacers on sides of the second trench and facing each other for defining a channel therebetween; and a fourth insulation material for filling the channel.

13. An integrated circuit comprising:

a semiconductor substrate and at least one trench formed therein;

spacers on sides of the at least one trench and facing each other for defining a channel therebetween, said spacers having lower portions tapering towards one another as a distance from a bottom of the at least one trench increases, and upper portions tapering outwardly; and insulation material on said spacers, and on a bottom of the at least one trench for delimiting a closed empty cavity in the channel.

14. An integrated circuit according to claim 13, wherein said spacers comprise a second insulation material.

15. An integrated circuit according to claim 13, wherein said second insulation material forms a plug for closing the cavity below an upper surface of said semiconductor substrate.

16. An integrated circuit according to claim 15, wherein an upper surface of said plug is recessed from the upper surface of said semiconductor substrate; and further comprising a third insulation material in the recess.

17. An integrated circuit according to claim 13, wherein the sides are tapered outwards from the bottom.

18. An integrated circuit according to claim 13, wherein the bottom is substantially flat.

19. An integrated circuit according to claim 13, wherein a depth of the at least one trench is greater than an average width thereof.

20. An integrated circuit according to claim 13, wherein said spacers are below a surface of said semiconductor substrate.

21. An integrated circuit according to claim 13, wherein said semiconductor substrate further includes a second trench formed therein, the second trench having a width greater than a width of the at least one trench; and further comprising:

spacers on sides of the second trench and facing each other for defining a channel therebetween; and a fourth insulation material for filling the channel.

* * * * *